United States Patent
Sato et al.

(10) Patent No.: US 6,825,088 B2
(45) Date of Patent: Nov. 30, 2004

(54) E-RAM WITH COBALT SILICIDE LAYER OVER SOURCE/DRAIN OF MEMORY CELL PART AND OVER SOURCE/DRAIN AND GATE WIRING OF LOGIC PART

(75) Inventors: Hidenori Sato, Tokyo (JP); Yasunori Sogo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/208,769

(22) Filed: Aug. 1, 2002

(65) Prior Publication Data

US 2003/0047789 A1 Mar. 13, 2003

(30) Foreign Application Priority Data

Sep. 7, 2001 (JP) .................................... 2001-272231

(51) Int. Cl.⁷ ............................................ H01L 21/336
(52) U.S. Cl. ...................... 438/300; 438/583; 438/630; 438/649; 438/651; 438/655
(58) Field of Search ................... 438/210, 241, 438/581, 583, 630, 649, 651, 655, 664, 721, 755, 300, 769

(56) References Cited

U.S. PATENT DOCUMENTS

| | | | | |
|---|---|---|---|---|
| 5,940,699 | A | * | 8/1999 | Sumi et al. .................. 438/233 |
| 6,069,037 | A | * | 5/2000 | Liao ............................ 438/241 |
| 6,261,899 | B1 | * | 7/2001 | Lane et al. .................. 438/253 |
| 6,531,353 | B2 | * | 3/2003 | Lee ............................. 438/210 |

FOREIGN PATENT DOCUMENTS

JP 2000-232076 8/2000

* cited by examiner

Primary Examiner—David Nelms
Assistant Examiner—Long Tran
(74) Attorney, Agent, or Firm—Burns, Doane, Swecker & Mathis, L.L.P.

(57) ABSTRACT

Gate wiring is formed serving as first gate wiring in a DRAM-forming area, and gate wiring 33 is formed as second gate wiring in a logic-forming area. Then, cobalt silicide layer 37 is formed over a source/drain diffused layer in the DRAM-forming area, and cobalt silicide layer is formed over a source/drain diffused layer and the gate wiring in the logic-forming area. Such formation of the cobalt silicide layer reduces the resistance of the gate wiring and the contact resistance, and thereby enables the high-speed operation of a semiconductor device even if the device is microfabricated.

4 Claims, 12 Drawing Sheets

DRAM-FORMING AREA     LOGIC-FORMING AREA

DRAM MEMORY CELL PART

LOGIC PART

E-RAM WITH COBALT SILICIDE LAYER OVER SOURCE/DRAIN OF MEMORY CELL PART AND OVER SOURCE/DRAIN AND GATE WIRING OF LOGIC PART

BACKGROUND OF THE INVENTION

1. Field of the Invention

The present invention relates to a semiconductor device and the method of manufacturing the device, and the invention particularly relates to a semiconductor device in which a memory device (memory cell part) and a logic circuit (logic part) are hybrid and the method of manufacturing the device.

2. Description of the Prior Art

In general, in a semiconductor device in which a memory device and a logic circuit are hybrid, a system LSI in which a DRAM is used as a memory device is referred to as an embedded DRAM (eRAM). In order to enhance the speed of the eRAM, a silicide layer, for instance, a $CoSi_2$ layer is formed over the diffused layer thereof in the process of manufacturing the eRAM.

FIGS. 10A–C, 11A–C, and 12 show schematic sectional process views in the method of manufacturing a semiconductor device such as a conventional eRAM. In the figures are shown active region 11, isolation area 12, gate oxide film ($SiO_2$) 13, polysilicon layer 14, tungsten silicide layer (WSi layer) 15, oxide film 16 of TEOS and the like, gate wiring 17, silicon nitride film (SiN film) 18, side wall 19, cobalt silicide layer ($CoSi_2$ layer) 20, oxide film 21 serving as an interlayer insulation film or dielectric (e.g., TEOS), contact hole 22, plugs 23 and 28, upper electrode 24a, lower electrode 24b, insulation film 24c, oxide films 26 and 27, and metal wiring 29.

Hereinafter, the method of manufacturing the conventional semiconductor device will next be described, referring to FIGS. 10A–12.

First of all, an area in which the part of a DRAM memory cell is formed (referred to as DRAM-forming area, hereinafter) and an area in which the part of logic is formed (referred to as logic-forming area, hereinafter) have been disposed on a semiconductor substrate (silicon substrate) as a base. In the DRAM-forming area and the logic-forming area, active region 11 and isolation area 12 are formed as underlayers, and over the underlayers, gate oxide film 13, polysilicon layer 14 serving as a gate electrode, and tungsten silicide layer 15 are successively formed by means of deposition. Then, for instance, oxide film 16 such as TEOS is deposited over WSi layer 15 (FIG. 10A).

After that, a gate wiring layer formed as mentioned above is patterned, to thereby form gate wiring 17 (FIG. 10B). A N-diffused layer and a P-diffused layer (not shown) are formed by means of ion implantation process, and then in order to form a gate sidewall, silicon nitride film (SiN film) 18 is deposited all over the surface (FIG. 10C).

In addition, the logic-forming area is processed by means of photolithographic processing and anisotropic etching, to thereby etch (etch back) the silicon nitride film and form sidewall 19 (FIG. 11A). Ion implantation is performed to form a P+ diffused layer and a N+ diffused layer (not depicted).

In the logic-forming area, $CoSi_2$ layer 20 is formed over the source/drain diffused layer (FIG. 11B). After depositing oxide film 21 becoming an interlayer insulation film in the DRAM-forming area and the logic-forming area, contact holes 22 connected with the source/drain diffused layer and the gate wiring is formed in both the DRAM-forming area and the logic-forming area by means of photolithographic processing and etching (FIG. 11C).

After that, plugs 23 are formed within contact holes 22, and simultaneously capacitors 24 are formed such that the capacitors are connected with right and left plugs 23 in the DRAM-forming area (capacitors 24 consist of upper electrode 24a and lower electrode 24b, and insulation films 24c are placed between upper electrode 24a and lower electrode 24b.). Subsequently, oxide films 26 and 27 are successively deposited over oxide film 21 in the DRAM-forming area and the logic-forming area; contact holes connected with plugs 23 are formed in oxide films 26 and 27; and plugs 28 are formed in these contact holes. In addition, metal wirings 29 connected with plugs 28 are formed on oxide film 27 (FIG. 12). Thereby, a semiconductor device so-called eRAM in which a DRAM memory cell part and a logic part are hybrid can be formed as shown in FIG. 12.

Because the conventional semiconductor device and the method of manufacturing the device have been arranged as mentioned above, there have been the following drawbacks.

That is, $CoSi_2$ layer 20 is formed over the source/drain diffused layer in the logic part of the eRAM and the like in order to reduce the contact resistance. In a LSI such as an eRAM, with recent development of microfabrication and high-speed of devices, the accuracy of microfabrication (for instance, to ensure the accuracy of alignment when forming the contact) has been required and simultaneously the reduction of the resistance of the diffused layer (source/drain diffused layer) and the wiring (gate wiring) has been required. However, although in the conventional eRAM, the reduction of the contact resistance of the source/drain diffused layer in the logic part is considered, the reduction of the contact resistance in the memory cell part of a RAM is not considered. Furthermore, in the logic part, the reduction of the resistance of the gate wiring is not considered.

Thus, in the conventional semiconductor device, it is difficult to reduce the contact resistance of the source/drain diffused layer in the memory cell part of the RAM, and in addition, it is difficult to reduce the contact resistance of the gate wiring also in the logic part. For this reason, with recent development of microfabrication of devices, there have been various drawbacks in high-speed operations of devices caused by the high contact resistance.

Because the conventional semiconductor device is arranged as mentioned above, there has been a drawback that the reduction of the contact resistance is difficult in the source/drain diffused layer of the RAM memory cell part and the gate wiring of the logic part, and that the operation of the device at high speed is difficult with increase of microfabrication of devices.

SUMMARY OF THE INVENTION

The present invention has been accomplished to solve the above-mentioned drawbacks. An object of the present invention is to provide a semiconductor device in which a circuit can operate at high speed even if the device is microfabricated because of the reduction of the contact resistance and the wiring resistance in the source/drain diffused layer of the memory cell part and in the gate wiring of the logic part, and to provide a method of manufacturing the semiconductor device.

According to a first aspect of the present invention, there is provided a semiconductor device having a memory cell part and a logic part formed in a semiconductor substrate, wherein in the memory cell part a cobalt silicide layer is formed at least over the source/drain diffused layer of the part, and in the logic part a cobalt silicide layer is formed over the source/drain diffused layer of the part, and the gate wiring of the part includes a cobalt silicide layer.

Therefore, the contact resistance of the source/drain diffused layers in the memory cell part and the logic part can be reduced, and the wiring resistance of the gate wiring in the logic part can be also reduced, resulting in performing high-speed circuit operations even if the semiconductor device is further microfabricated.

According to a second aspect of the present invention, there is provided a method of manufacturing a semiconductor device in which a memory cell part and a logic part are formed in a semiconductor substrate, the method including: a first step in which a gate wiring is formed serving as a first gate wiring in a first area in which the memory cell part is formed and a gate wiring is formed serving as a second gate wiring in a second area in which the logic part is formed, and a second step in which a cobalt silicide layer is formed over a source/drain diffused layer in the first area and a cobalt silicide layer is formed over a source/drain diffused layer and the gate wiring in the second area.

Therefore, the contact resistance of the source/drain diffused layer in the memory cell part and the logic part can be reduced, and additionally the wiring resistance in the gate wiring can be reduced, resulting in performing high-speed circuit operations even if the semiconductor device is further microfabricated.

According to a third aspect of the present invention, there is provided a method of manufacturing a semiconductor device in which a memory cell part and a logic part are formed in a semiconductor substrate, the method including: a first step in which a gate wiring comprising a cobalt silicide layer is formed serving as a first gate wiring in a first area in which the memory cell part is formed and a gate wiring comprising a cobalt silicide layer is formed serving as a second gate wiring in a second area in which the logic part is formed; and a second step in which a cobalt silicide layer is formed over a source/drain diffused layer in the first area and a cobalt silicide layer is formed over a source/drain diffused layer in the second area.

Therefore, the contact resistance and the wiring resistance of the source/drain diffused layers and the gate wirings in the memory cell part and the logic part can be reduced by the cobalt silicide ($CoSi_2$) layers, resulting in performing further high-speed circuit operations even if the semiconductor device is microfabricated.

DETAILED DESCRIPTION OF THE PREFERRED EMBODIMENTS

Figure 1A:
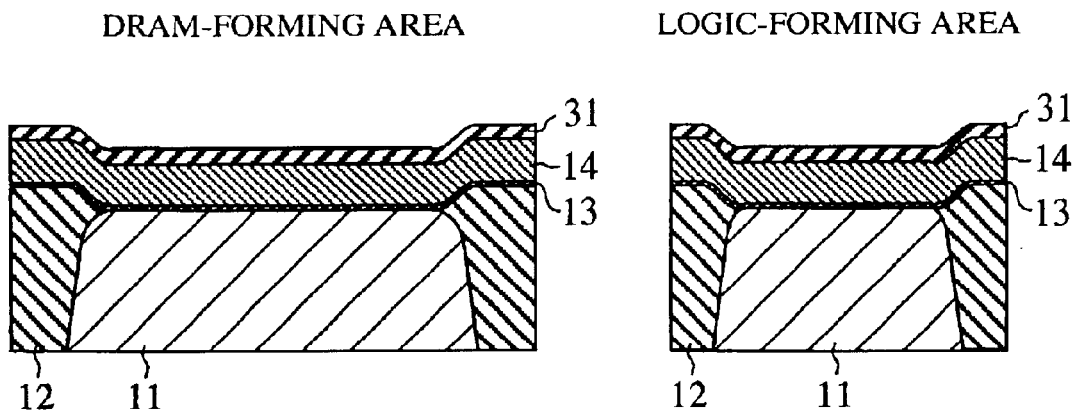
FIGS. 1A–1C show schematic sectional process views in the method of manufacturing a semiconductor device according to an embodiment 1 of the present invention.

An embodiment of the present invention will be described below.

EMBODIMENT 1

Herein, a semiconductor device such as an eRAM in which a DRAM memory cell part is hybrid as a memory cell part will be described.

FIGS. 1A–C, 2A–C, 3A and 3B show schematic sectional process views in a method of manufacturing a semiconductor device according to an embodiment 1 of the present invention. In the figures are shown active region 11, isolation area 12, gate oxide film ($SiO_2$) 13, polysilicon layer 14, silicon nitride films (SiN films) 31 and 34, resist 32, gate wiring 33, oxide film 35 formed from BPTEOS or the like, side wall 36 for a gate, cobalt silicide layer ($CoSi_2$ layer) 37, oxide film 38 as an interlayer insulation film, and contact hole 39.

The method of manufacturing a semiconductor device according to the embodiment 1 will be described, referring to FIGS. 1A–3B hereinbelow.

An area in which the part of a DRAM memory cell (referred to as a DRAM-forming area hereinafter) is formed and an area in which the part of logic (referred to as a logic-forming area hereinafter) is formed have been disposed on a semiconductor substrate (silicon substrate) as a foundation. Active region 11 and isolation area 12 are formed in the semiconductor substrate as an underlayer. Gate oxide film ($SiO_2$) 13 and polysilicon layer 14 serving as a gate electrode are deposited over the underlayer. Silicon nitride film (SiN film) 31 is deposited on the polysilicon layer (FIG. 1A).

Figure 1B:
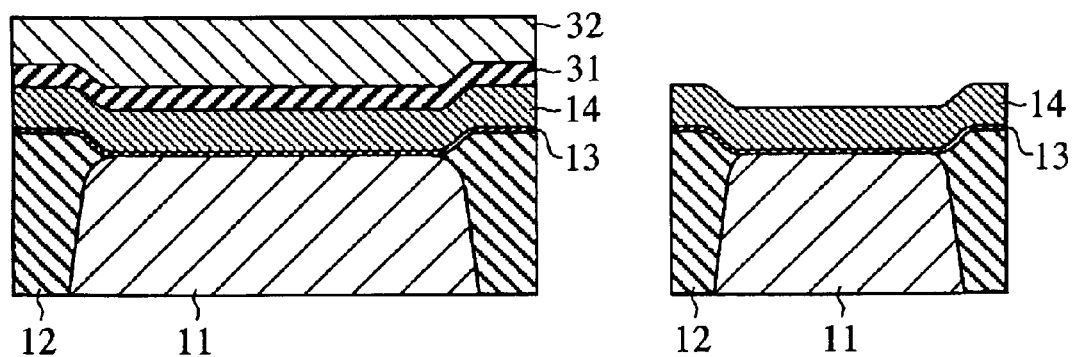
Figure 1C:
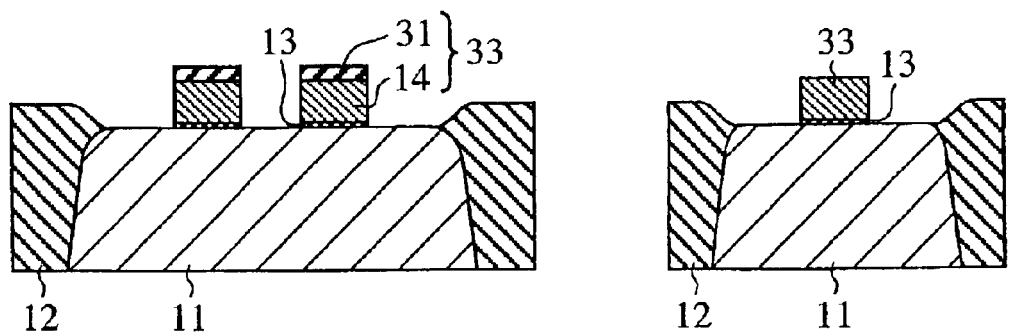
Figure 2A:
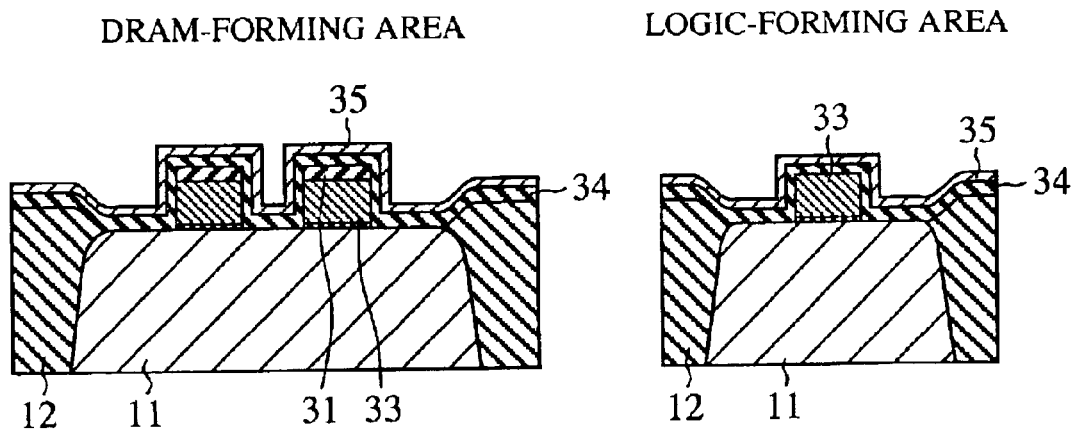
FIGS. 2A–2C show schematic sectional process views in the method of manufacturing a semiconductor device according to the embodiment 1 of the present invention.

Thereafter, patterned resist 32 is applied to the DRAM-forming area such that the resist covers only silicon nitride film 31 in the area. Silicon nitride film 31 is etched through resist 32 as a mask, to thereby leave silicon nitride film 31 only in the DRAM-forming area (FIG. 1B). After removing remaining resist 32, a gate wiring layer formed as mentioned above is photolithographically patterned and microfabricated by means of dry-etching process, to thereby obtain gate wiring 33 (FIG. 1C). A N-diffused layer and a P-diffused layer are formed by means of ion implantation, and silicon nitride film (SiN film) 34 and oxide film 35 for forming a gate sidewall are deposited all over the surface (FIG. 2A).

Figure 2B:
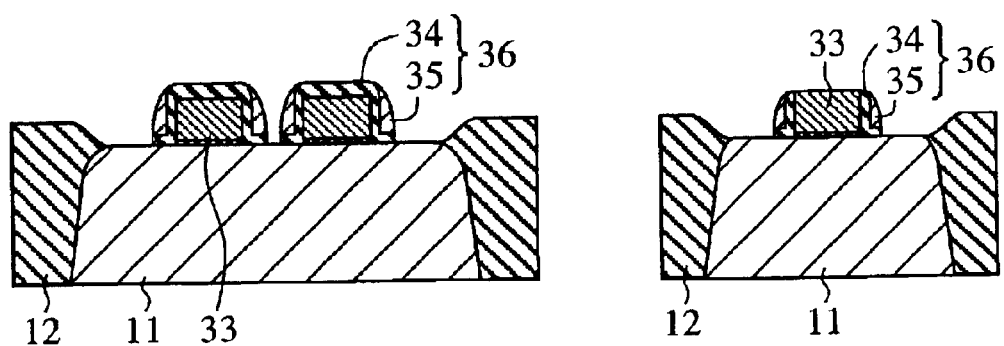
Figure 2C:
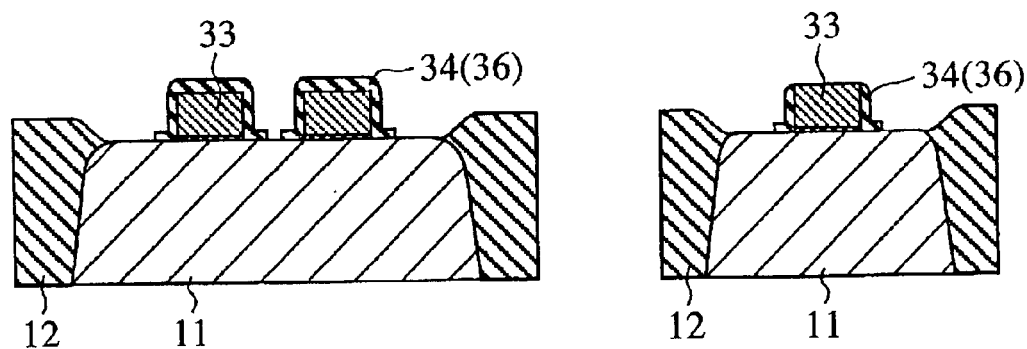

After that, an etchback process done all over the surface by means of anisotropic etching, to thereby form gate sidewall 36 by leaving a part of silicon nitride film 34 and oxide film 35 (FIG. 2B). A photolithographic process and an ion implantation process are performed around the logic-forming area and the DRAM-forming area. After a N+ diffused layer and a P+ diffused layer are formed, oxide film 35 remaining in sidewall 36 is removed by means of wet-etching in order to increase the width between the gates in the DRAM-forming area, that is, in order to improve the burying characteristics of the interlayer insulation film (FIG. 2C). When wet-etching the part, hydrofluoric acid (HF) for instant is used. However, isolation area 12 is not etched because of a difference between the film properties of the oxide films of isolation area 12 and sidewall 36. For example, BPTEOS is used in order to form the oxide film of sidewall 36 as mentioned above, and a thermal oxide film is used for isolation area 12. An etching is selectively performed upon wet-etching.

Figure 3A:
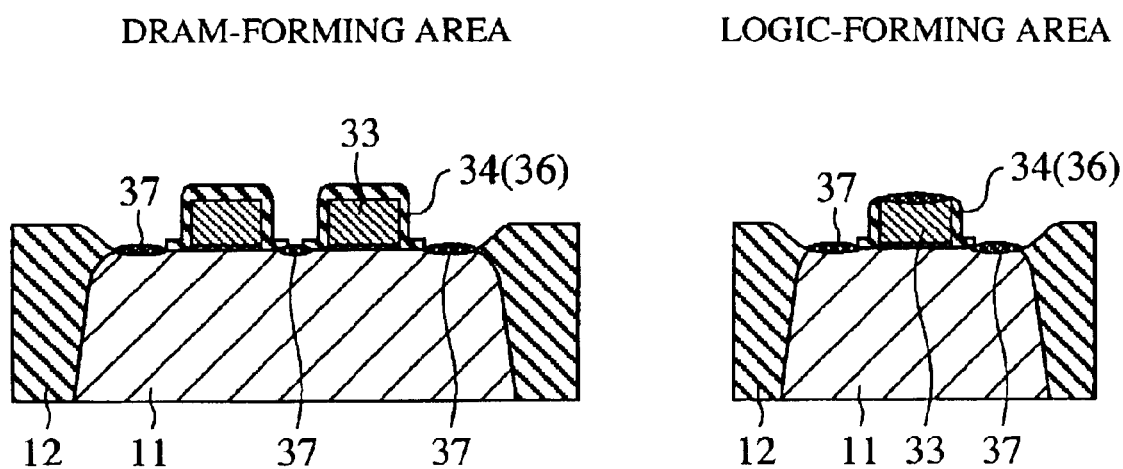
FIGS. 3A and 3B show schematic sectional process views in the method of manufacturing a semiconductor device according to the embodiment 1 of the present invention.

Next, $CoSi_2$ layer 37 is formed over the source/drain diffused layer in the logic-forming area and the DRAM-form area, and $CoSi_2$ layer 37 is formed over the gate wiring in the logic-forming area (FIG. 3A). When $CoSi_2$ layer 37 is formed, after Co is deposited, for instance, all over the surface by means of sputtering or depositing method, a heat-treatment such as annealing is done, to thereby form $CoSi_2$ layer 37.

Figure 3B:
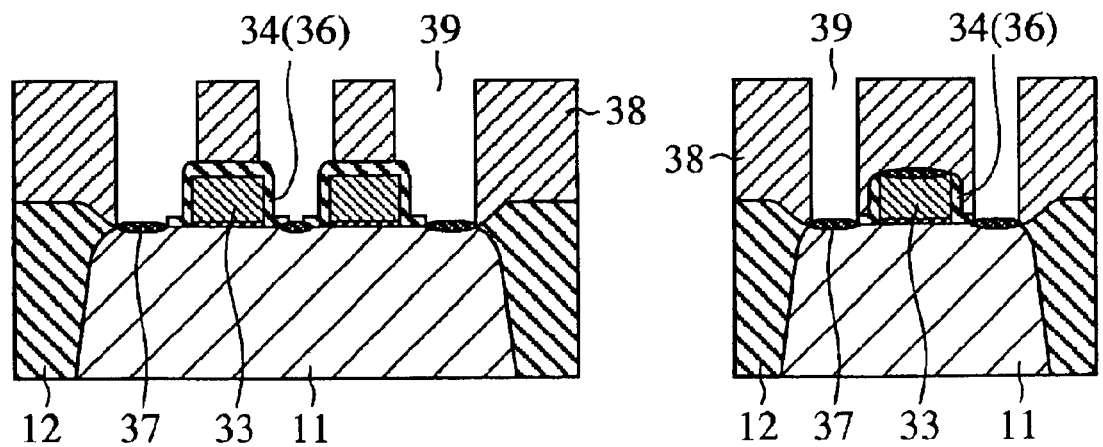

After that, oxide film 38 becoming an interlayer insulation film is deposited all over the surface, and photolithographically processed and etched, to thereby form contact holes 39 connected with the source/drain diffused layers and the gate wirings in the logic-forming area and the DRAM-forming area (FIG. 3B).

Figure 12:
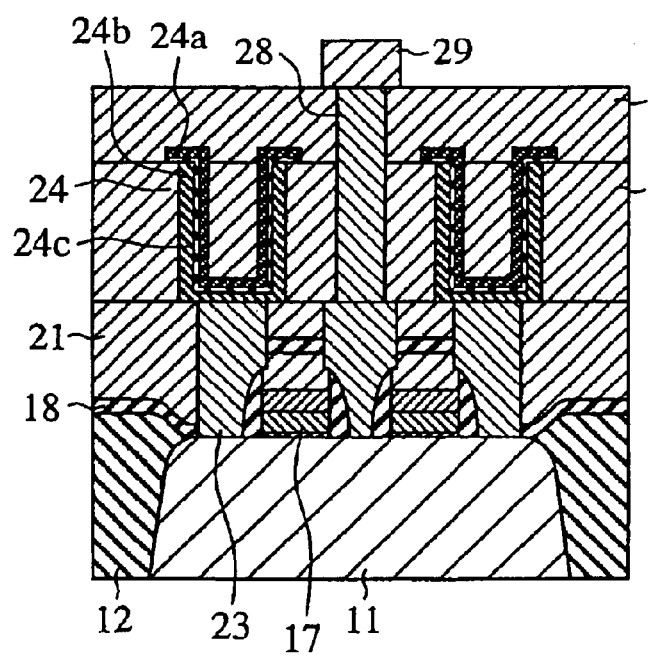
FIG. 12 is a sectional view in the conventional semiconductor device.
Figure 12:
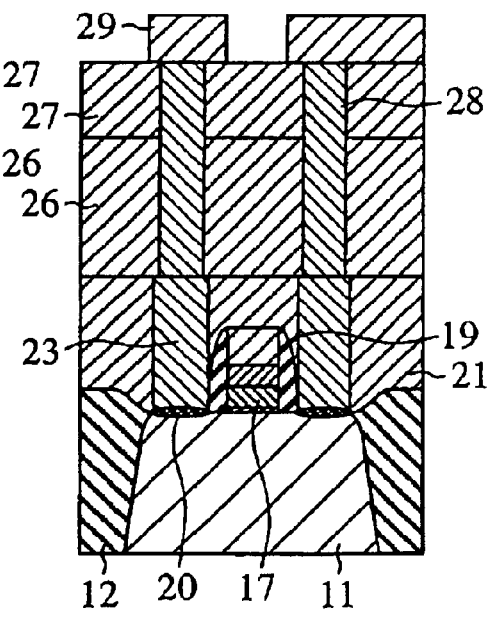

Then, as mentioned referring to FIG. 12 in the prior art, plugs 23 are formed within contact holes 39, and simultaneously capacitors 24 each are formed such that the capacitors are connected with right and left plugs 23 in the DRAM-forming area. Subsequently, oxide films 26 and 27 are successively deposited over oxide film 38 in the DRAM-forming area and the logic-forming area; contact holes connected with plugs 23 are formed in oxide films 26 and 27; and plugs 28 are formed in these contact holes. In addition, metal wirings 29 connected with plugs 28 are formed on oxide film 27. In such a way, a semiconductor device (eRAM) in which a DRAM memory cell part and a logic part are hybrid can be formed.

As mentioned above, according to the embodiment 1, because the $CoSi_2$ layer is formed over the source/drain diffused layer in the DRAM memory cell part, and additionally, the $CoSi_2$ layer is arranged to be formed over the source/drain diffused layer and the gate wiring in the logic part, the contact resistance can be reduced in the source/drain diffused layers of the memory cell part and the logic part, and in addition, the wiring resistance in the gate wiring of the logic part can be also reduced. As a result, high-speed circuit operations of the semiconductor device can be achieved even if the semiconductor device is microfabricated.

Additionally, because the sidewall of the gate wiring of the memory cell part is formed of only silicon nitride film, the width between the adjacent gate wirings can be increased. As a result, not only the burying characteristics of the interlayer insulation film in the post-process can be improved, but also the accuracy of microfabrication can be ensured when self-aligned contacts are formed in the DRAM memory cell part.

EMBODIMENT 2

FIGS. 4A–C, 5A–C, 6A and 6B show schematic sectional process views in a method of manufacturing a semiconductor device according to an embodiment 2 of the present invention. Referring to the figures, reference numeral 15 is a tungsten silicide layer (WSi layer), and reference numeral 41 is a gate wiring. The same components as those of the embodiment 1 are designated by the same reference numerals.

Hereinafter, the method of manufacturing a semiconductor device according to the embodiment 2 will be described, referring to FIGS. 4A–6B.

Figure 4A:
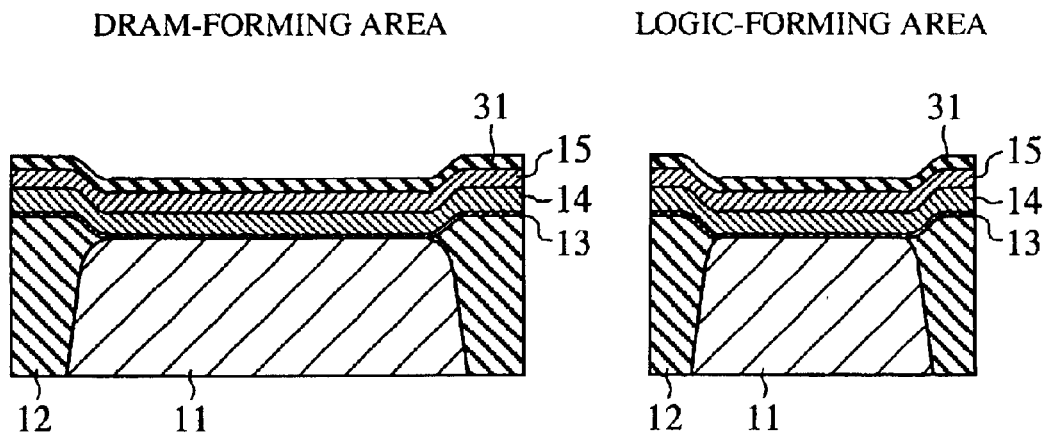
FIGS. 4A–4C show schematic sectional process views in the method of manufacturing a semiconductor device according to an embodiment 2 of the present invention.

First of all, active region 11 and isolation area 12 are formed in a semiconductor substrate, to thereby form an underlayer. Gate oxide film 13, polysilicon layer 14 serving as a gate electrode, and WSi layer 15 are successively deposited over the underlayer. Silicon nitride film (SiN film) 31 is deposited over WSi layer 15 (FIG. 4A).

Figure 4B:
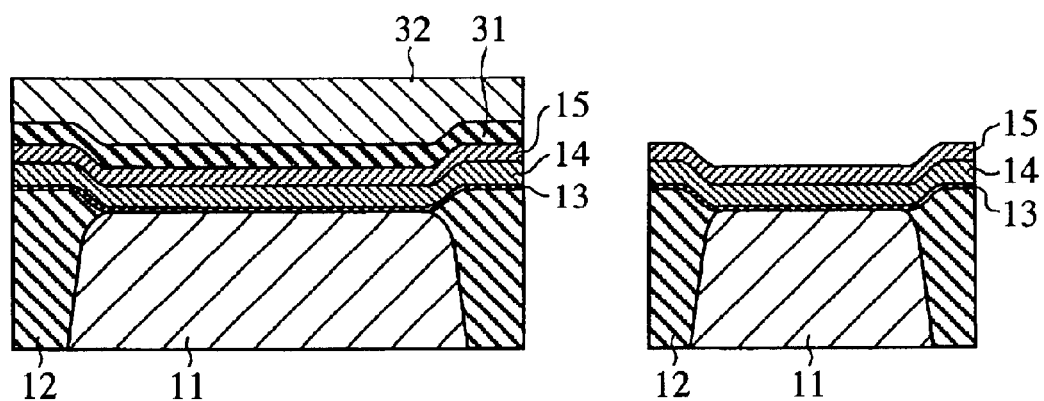
Figure 4C:
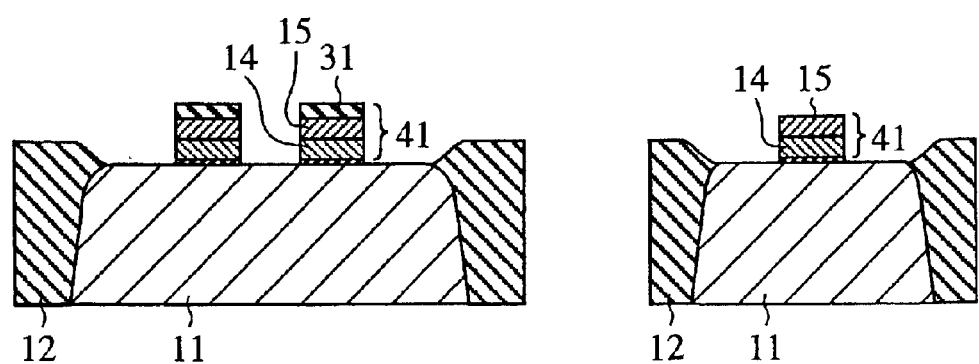
Figure 5A:
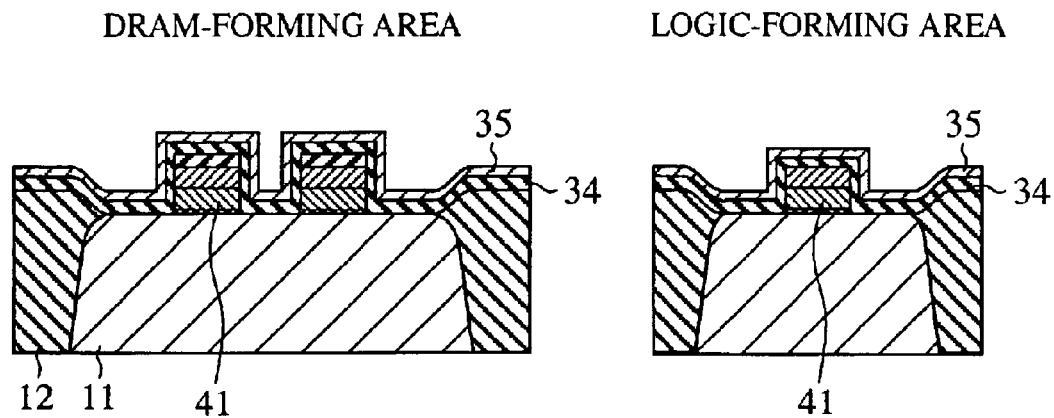
FIGS. 5A–5C show schematic sectional process views in the method of manufacturing a semiconductor device according to the embodiment 2 of the present invention.

Then, resist 32 is applied to the DRAM-forming area such that the resist covers only silicon nitride film 31 in the area. Silicon nitride film 31 is etched through resist 32 as a mask, to thereby leave silicon nitride film 31 only in the DRAM-forming area (FIG. 4B). After removing remaining resist 32, a gate wiring layer formed as mentioned above is patterned, to thereby obtain gate wiring 41 (FIG. 4C). In addition, a N-diffused layer and a P-diffused layer are formed by means of ion implantation, and silicon nitride film (SiN film) 34 and oxide film ($SiO_2$: BPTEOS) 35 for forming a gate sidewall are deposited all over the surface (FIG. 5A).

Figure 5B:
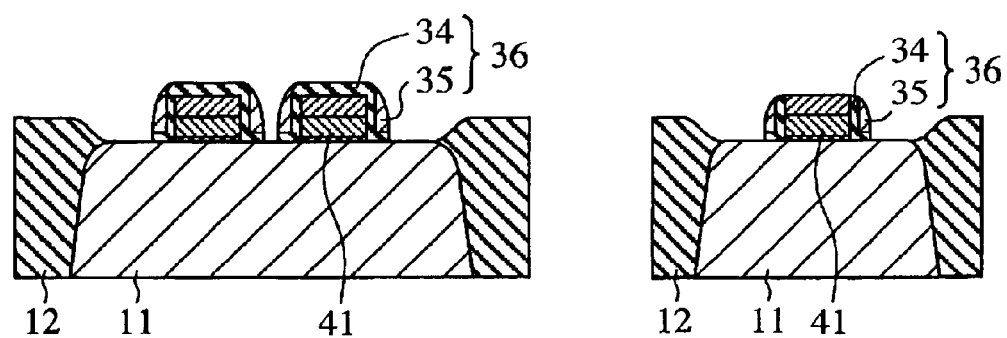
Figure 5C:
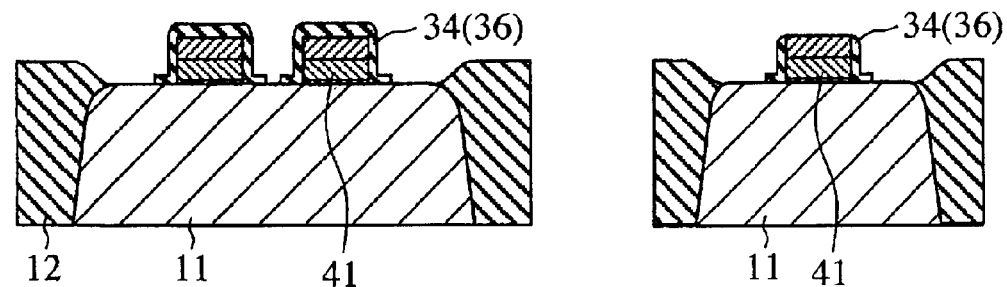

Thereafter, an etchback process is done all over the surface by means of anisotropic etching, to thereby form gate sidewall 36 by leaving a part of silicon nitride film 34 and oxide film 35 (FIG. 5B). A photolithographic process and an ion implantation process are performed around the logic-forming area and the DRAM-forming area. After a N+ diffused layer and a P+ diffused layer are thereby formed, oxide film 35 remaining in sidewall 36 is removed by means of wet-etching in order to increase the width between the gates in the DRAM-forming area, that is, in order to enhance the burying characteristic of the interlayer insulation film (FIG. 5C).

Figure 6A:
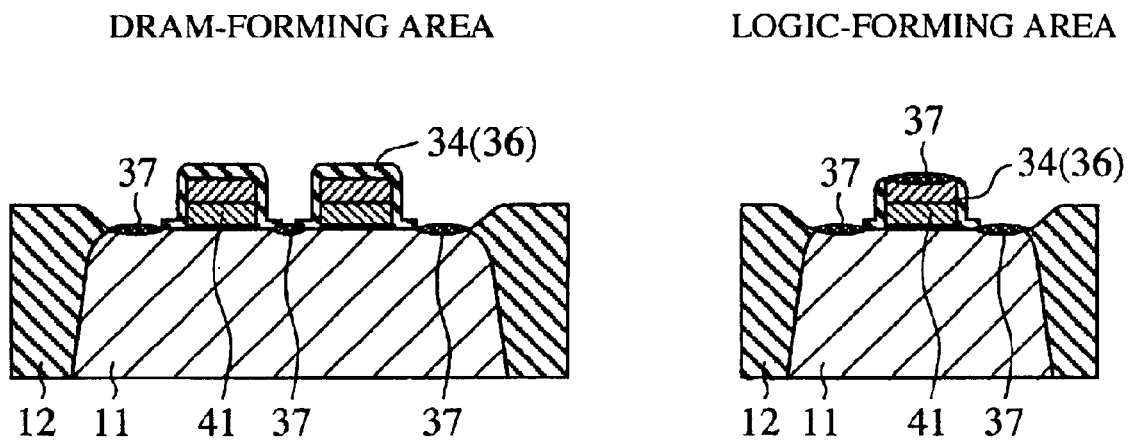
FIGS. 6A and 6B show schematic sectional process views in the method of manufacturing a semiconductor device according to the embodiment 2 of the present invention.
Figure 6B:
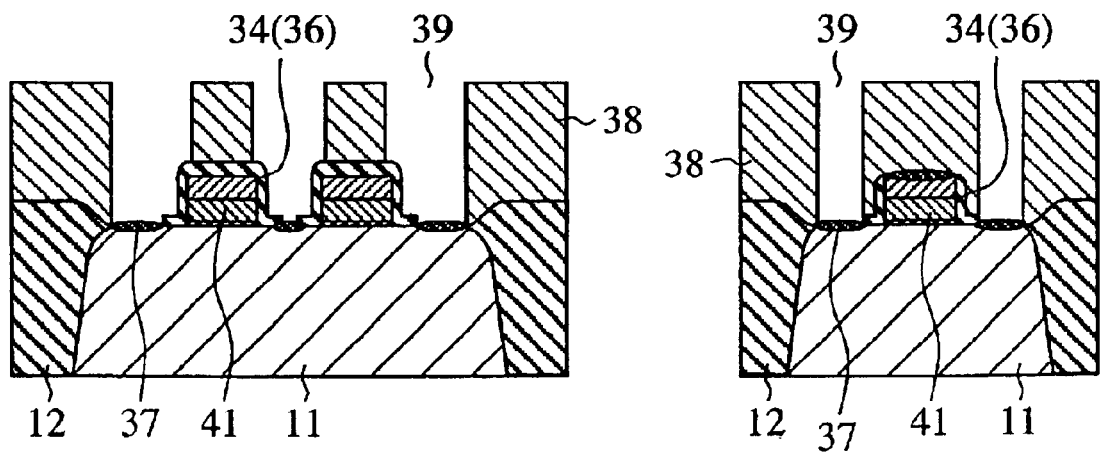

Next, $CoSi_2$ layer 37 is formed over the source/drain diffused layer in the logic-forming area and the DRAM-form area, and simultaneously $CoSi_2$ layer 37 is formed over the gate wiring in the logic-forming area (FIG. 6A). After that, oxide film 38 serving as an interlayer insulation film is deposited all over the surface, and photolithographically processed and etched, to thereby form contact holes 39 connected with the source/drain diffused layers and the gate wirings in the logic-forming area and the DRAM-forming area (FIG. 6B).

Then, as mentioned referring to FIG. 12, plugs 23 are formed within contact holes 39, and simultaneously capacitors 24 each are formed such that the capacitors are connected with right and left plugs 23 in the DRAM-forming area. Subsequently, oxide films 26 and 27 are successively deposited over oxide film 38 in the DRAM-forming area and the logic-forming area; contact holes connected with plugs 23 are formed in oxide films 26 and 27; and plugs 28 are formed in these contact holes. In addition, metal wirings 29 connected with plugs 28 are formed on oxide film 27. Thereby, a semiconductor device in which a DRAM memory cell part and a logic part are hybrid is formed.

Incidentally, in the embodiment 2, because the gate wiring of the memory cell part has a layered structure of polysilicon and WSi, there is a merit that the resistance of the gate wiring of the memory cell part can be lowered more than in the structure used in the embodiment 1. The formation of the $CoSi_2$ layer over the gate wiring also in the logic part advantageously reduces the wiring resistance and improves the speed of the circuit.

As mentioned above, according to the embodiment 2, because the $CoSi_2$ layer is formed over the source/drain diffused layer in the DRAM memory cell part, and additionally, the $CoSi_2$ layer is arranged to be formed over the source/drain diffused layer and the gate wiring in the logic part, the contact resistance can be reduced in the source/drain diffused layers of the memory cell part and the logic part, and in addition, the wiring resistance in the gate wiring of the logic part can be further reduced by the combination of WSi and $CoSi_2$. As a result, the high-speed circuit operations of the semiconductor device is achieved even if the semiconductor device is microfabricated.

Additionally, as mentioned in the embodiment 1, because the sidewall of the gate wiring of the memory cell part is formed of only silicon nitride film, the width between the adjacent gate wirings can be increased. As a result, not only the burying characteristic of the interlayer insulation film in the post-process is improved, but also the accuracy of microfabrication can be ensured when self alignment contact is formed in the DRAM memory cell part.

Additionally, in the embodiment 2, because the gate wiring has a layered structure (double structure) of polysilicon and WSi in the DRAM memory cell part, the resistance of the gate wiring can be furthermore reduced in the memory cell part as compared with the embodiment 1, and the high speed operations of the device can be achieved.

EMBODIMENT 3

FIGS. 7A–C, 8A–C and 9A–C show schematic sectional process views in a method of manufacturing a semiconductor device according to an embodiment 3 of the present invention. Referring to the figures, reference numeral 51 is a cobalt silicide layer ($CoSi_2$ layer), and reference numeral 52 is an oxide film made of TEOS and the like. The same components as those of the embodiments 1 and 2 are designated by the same reference numerals.

Hereinafter, the method of manufacturing a semiconductor device according to Embodiment 3 will be described, referring to FIGS. 7A–9C.

Figure 7A:
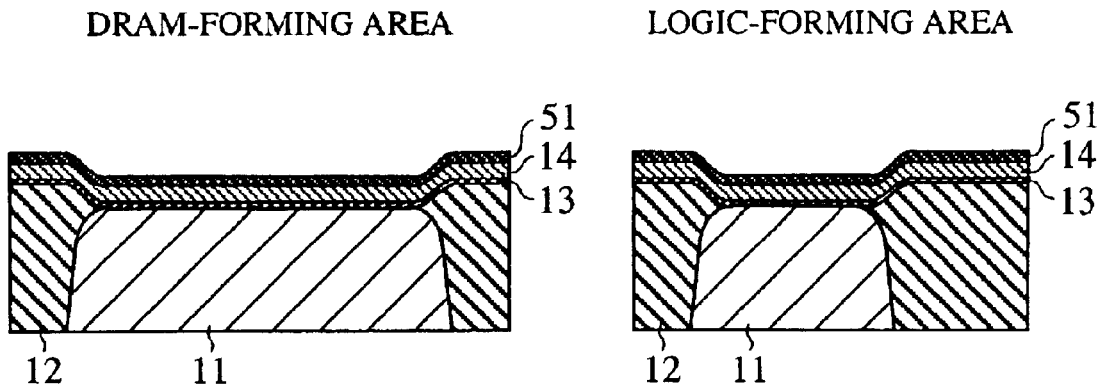
FIGS. 7A–7C show schematic sectional process views in the method of manufacturing a semiconductor device according to an embodiment 3 of the present invention.
Figure 7B:
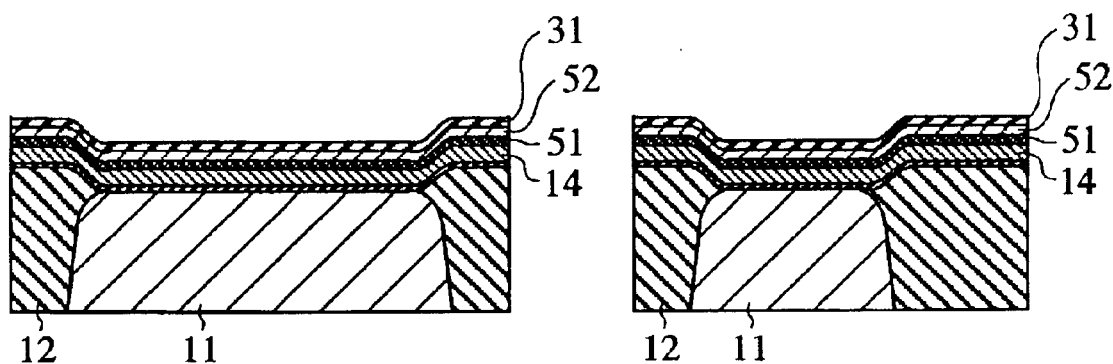

First of all, active region 11 and isolation area 12 are formed in a semiconductor substrate as a foundation, to thereby form an underlayer. Gate oxide film 13 and polysilicon layer 14 serving as a gate electrode are deposited over the underlayer, and then $CoSi_2$ layer 51 is deposited over polysilicon layer 14 (FIG. 7A). Then, oxide film 52 is deposited over $CoSi_2$ layer 51, and further silicon nitride film 31 is deposited over oxide film 52 (FIG. 7B).

Figure 7C:
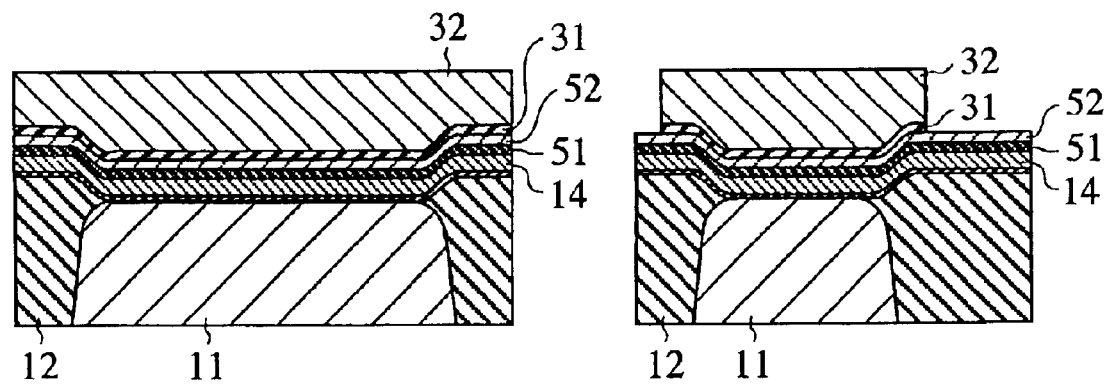

Resist 32 is applied to the substrate surface such that the resist covers silicon nitride film 31 in the DRAM-forming area and simultaneously resist 32 is applied over silicon nitride film 31 corresponding active area 11 in the logic-forming area. Silicon nitride film 31 is etched by use of resist 32 as a mask, to thereby leave silicon nitride film 31 all over the DRAM-forming area, and simultaneously leave silicon nitride film 31 corresponding to active area 11 in the logic-forming area (FIG. 7C).

Figure 8A:
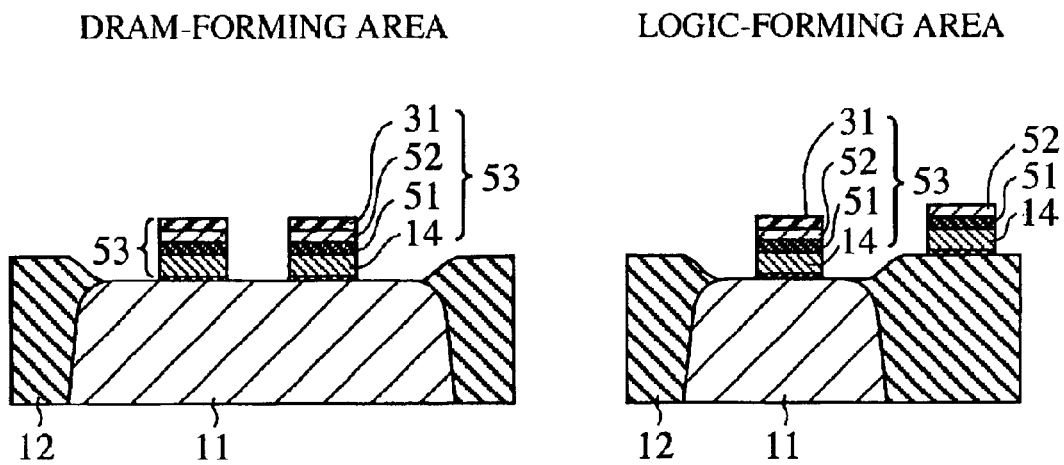
FIGS. 8A–8C show schematic sectional process views in the method of manufacturing a semiconductor device according to the embodiment 3 of the present invention.
Figure 8B:
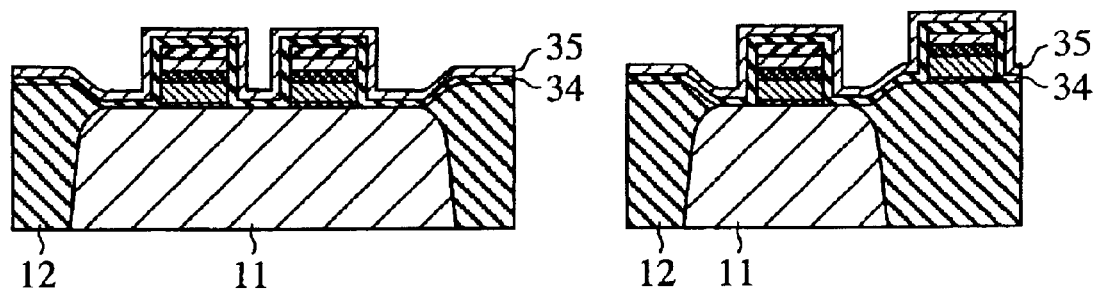

After removing remaining resist 32, a gate wiring layer formed as mentioned above is patterned, to thereby obtain gate wiring 53 (FIG. 8A). In addition, a N-diffused layer and a P-diffused layer are formed by means of ion implantation, and silicon nitride film (SiN film) 34 and oxide film (for instance BPTEOS) 35 for forming a gate sidewall are deposited all over the surface (FIG. 8B).

Figure 8C:
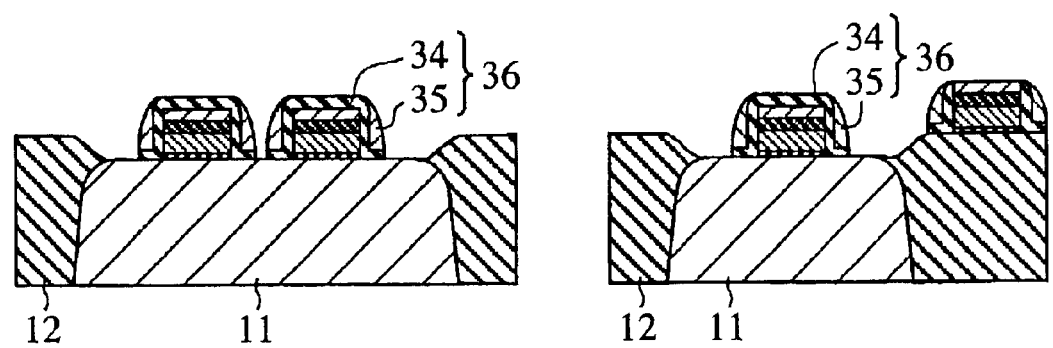
Figure 9A:
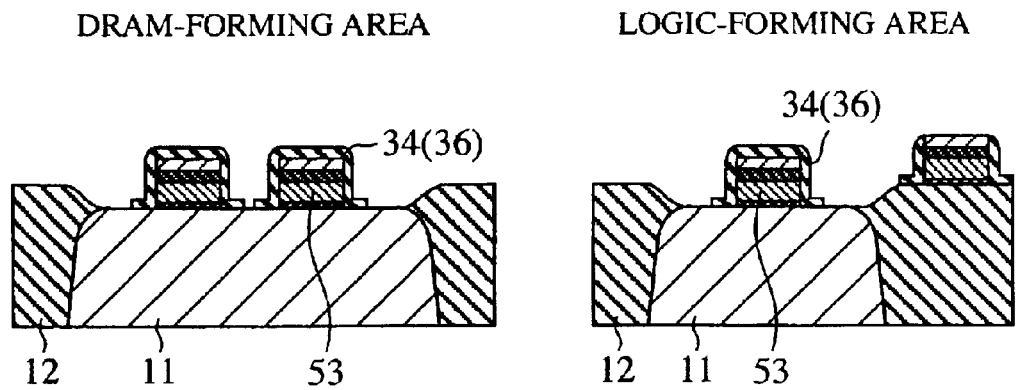
FIGS. 9A–9C show schematic sectional process views in the method of manufacturing a semiconductor device according to the embodiment 3 of the present invention.

Thereafter, an etchback process is done all over the surface by means of anisotropic etching, to thereby form gate sidewall 36 by leaving a part of silicon nitride film 34 and oxide film 35 (FIG. 8C). A photolithographic process and an ion implantation process are performed around the logic-forming area and the DRAM-forming area. After a N+ diffused layer and a P+ diffused layer are thereby formed, oxide film 35 remaining in sidewall 36 is removed by means of wet-etching process in order to increase the width between the gates in the DRAM-form area (FIG. 9A).

Figure 9B:
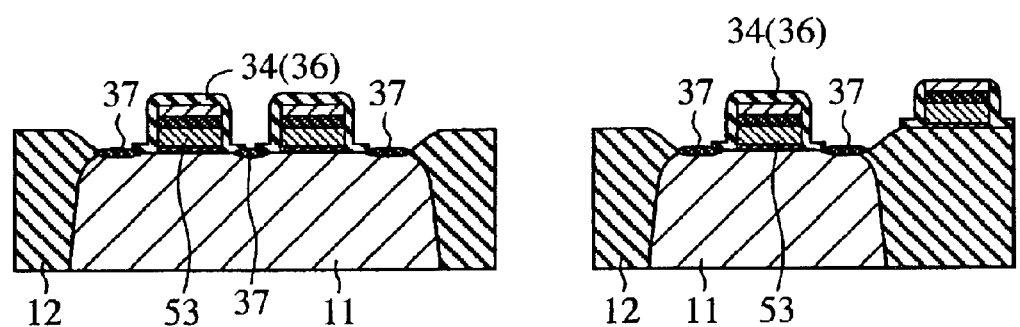
Figure 9C:
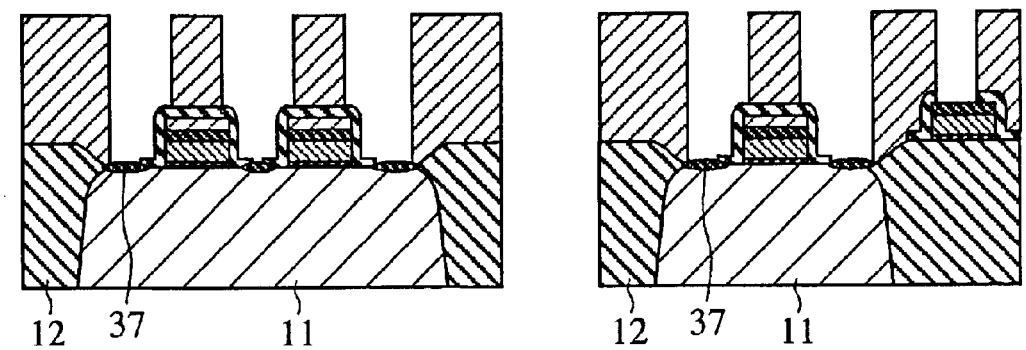
Figure 10A:
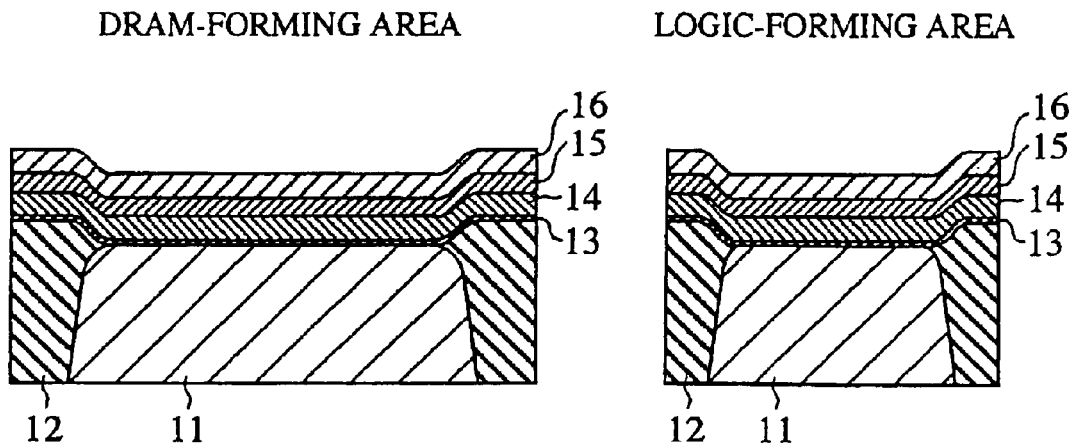
FIGS. 10A–10C show schematic sectional process views in the method of manufacturing a conventional semiconductor device.
Figure 10B:
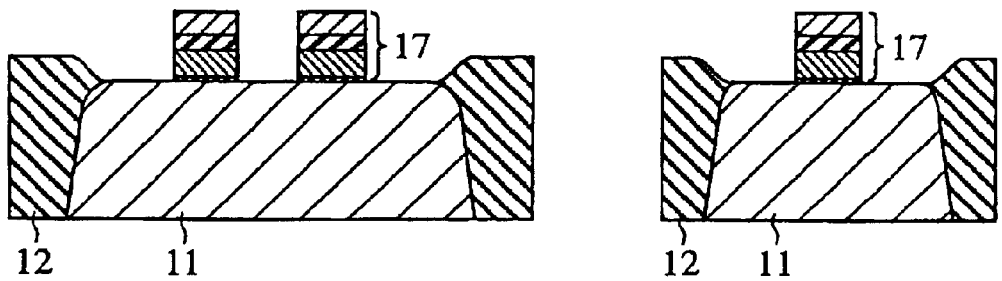
Figure 10C:
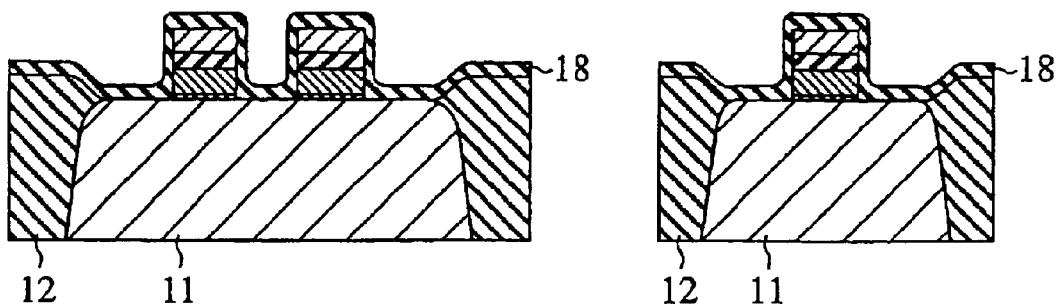
Figure 11A:
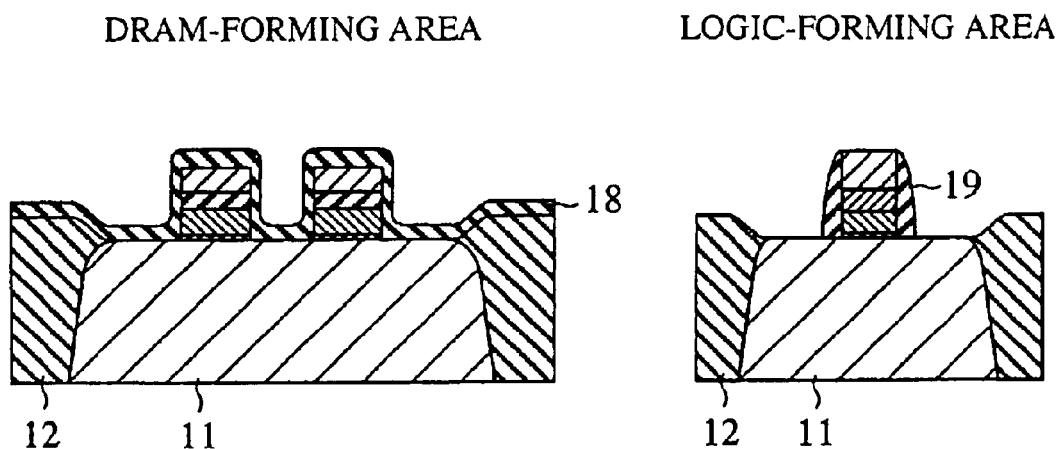
FIGS. 11A–11C show schematic sectional process views in the method of manufacturing the conventional semiconductor device.
Figure 11B:
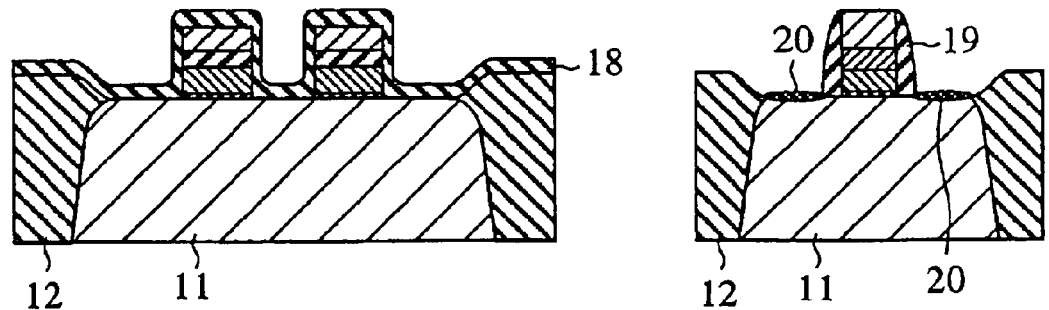
Figure 11C:
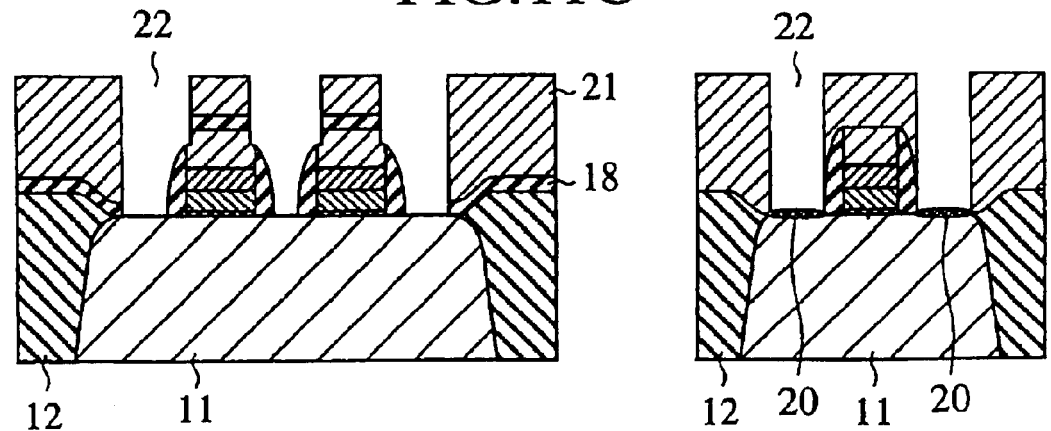

Then, $CoSi_2$ layer 37 is formed over the source/drain diffused layers in the logic-forming area and the DRAM-form area (FIG. 9B). After that, oxide film 38 serving as an interlayer insulation film is deposited all over the surface, and photolithographically processed and etched, to thereby form contact holes 39 connected with the source/drain diffused layers and the gate wirings in the logic-forming area and the DRAM-forming area (FIG. 9C). At that time, polysilicon layer 14 is removed in gate wiring 53 formed on isolation area 12, and $CoSi_2$ layer 51 is in an exposed state.

Then, as mentioned referring to FIG. 12, plugs 23 are formed within contact holes 39, and simultaneously capacitors 24 are formed such that the capacitors are connected with right and left plugs 23 in the DRAM-forming area. Subsequently, oxide films 26 and 27 are successively deposited over oxide film 38 in the DRAM-forming area and the logic-forming area; contact holes connected with plugs 23 are formed in oxide films 26 and 27; and plugs 28 are formed in these contact holes. In addition, metal wirings 29 connected with plugs 28 are formed on oxide film 27. Thereby, a semiconductor device in which a DRAM memory cell part and a logic part are hybrid is formed.

As mentioned above, according to the embodiment 3, because $CoSi_2$ layer 51 is formed over the source/drain diffused layer in the DRAM memory cell part and the logic part, and additionally, the gate wiring is arranged to consist of $CoSi_2$ layer 51 and polysilicon layer 14, the contact resistance in the source/drain diffused layers of the DRAM memory cell part and the logic part can be greatly reduced, and in addition, the wiring resistance can be also minimized because the gate wiring also has a layered structure of $CoSi_2$. As a result, the high-speed circuit operations of the semiconductor device are achieved even if the semiconductor device is microfabricated.

Additionally, as mentioned in the embodiments 1 and 2, because the sidewall of the gate wiring in the memory cell part is formed of only silicon nitride film, the width between the adjacent gate wirings can be increased. As a result, not only the burying characteristic of the interlayer insulation film in the post-process can be improved, but also the accuracy of microfabrication can be ensured when self alignment contact is formed in the DRAM memory cell part.

What is claimed is:

1. A method of manufacturing a semiconductor device in which a memory cell part and a logic part are formed in a semiconductor substrate, said method comprising:

a first step of simultaneously forming gate wirings in first and second areas to serve as a first gate wiring in the first area in which the memory cell part is formed and a second gate wiring in the second area in which the logic part is formed, wherein a top of the second gate wiring is exposed, and a second step of forming a cobalt silicate layer over a source/drain diffused layer in the first area and over a source/drain diffused layer and the gate wiring in the second area.

2. The method of manufacturing a semiconductor device according to claim 1, further comprising a third step of forming a double structure wall formed of silicon-silicon nitride film and silicon oxide film, over the first gate wiring and the second gate wiring in succession to the first step; and a fourth step of selectively removing the oxide film to form a sidewall formed of the silicon nitride on the first gate wiring and the second gate wiring.

3. The method of manufacturing a semiconductor device according to claim 2, wherein the kit step comprising:

a fifth step of successively forming a polysilicon layer and a silicon nitride film over the first area and the second area;

a sixth step of leaving the silicon nitride film only in the first area; and a seventh step of forming the first wiring and the second gate wiring by means of patterning in the first area and the second area.

4. The method of manufacturing a semiconductor device according to claim 2, wherein the first step comprising:

a fifth step of successively forming a polysilicon layer, a tungsten silicide layer, and a silicon nitride film over the first area and the second area;

a sixth step of leaving the silicon nitride film only in the first area; and a seventh step of forming the first wiring and the second gate wiring by means of patterning in the first area and the second area.

* * * * *